United States Patent
Yang et al.

(10) Patent No.: US 11,094,631 B2
(45) Date of Patent: Aug. 17, 2021

(54) GRAPHENE LAYER FOR REDUCED CONTACT RESISTANCE

(71) Applicant: Taiwan Semiconductor Manufacturing Co., Ltd., Hsin-Chu (TW)

(72) Inventors: Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 8 days.

(21) Appl. No.: 16/560,585

(22) Filed: Sep. 4, 2019

(65) Prior Publication Data

US 2020/0135655 A1  Apr. 30, 2020

Related U.S. Application Data

(60) Provisional application No. 62/750,485, filed on Oct. 25, 2018.

(51) Int. Cl.
*H01L 23/532* (2006.01)
*H01L 21/768* (2006.01)
*H01L 23/528* (2006.01)
*H01L 23/522* (2006.01)
*H01L 21/321* (2006.01)

(52) U.S. Cl.
CPC .. *H01L 23/53276* (2013.01); *H01L 21/76802* (2013.01); *H01L 21/76846* (2013.01); *H01L 21/76864* (2013.01); *H01L 21/76871* (2013.01); *H01L 21/76877* (2013.01); *H01L 23/5226* (2013.01); *H01L 23/5283* (2013.01); *H01L 21/3212* (2013.01); *H01L 21/7684* (2013.01)

(58) Field of Classification Search
CPC ......... H01L 23/53276; H01L 21/76802; H01L 21/76871; H01L 21/76864; H01L 21/76846; H01L 23/5283; H01L 23/5226; H01L 21/76877; H01L 21/3212; H01L 21/7684; H01L 21/76876; H01L 23/53238; H01L 21/76867; H01L 21/76843; H01L 21/76852; H01L 23/53209; H01L 23/53228
See application file for complete search history.

(56) References Cited

U.S. PATENT DOCUMENTS

| | | | | |
|---|---|---|---|---|
| 2014/0106561 A1* | 4/2014 | Niyogi | ............... | H01L 21/76867 438/643 |
| 2014/0191400 A1* | 7/2014 | Chien | ............... | H01L 21/76826 257/751 |
| 2018/0033734 A1* | 2/2018 | Zhou | ................. | H01L 21/76805 |
| 2018/0350913 A1* | 12/2018 | Yang | ................. | H01L 23/53223 |
| 2019/0006230 A1* | 1/2019 | Kuo | .................... | H01L 23/5329 |
| 2020/0243383 A1* | 7/2020 | Huang | ............... | H01L 21/76843 |

* cited by examiner

*Primary Examiner* — John P. Dulka
(74) *Attorney, Agent, or Firm* — Haynes and Boone, LLP

(57) ABSTRACT

A method includes forming a trench within a dielectric layer, the trench comprising an interconnect portion and a via portion, the via portion exposing an underlying conductive feature. The method further includes depositing a seed layer within the trench, depositing a carbon layer on the seed layer, performing a carbon dissolution process to cause a graphene layer to form between the seed layer and the underlying conductive feature, and filling a remainder of the trench with a conductive material.

20 Claims, 9 Drawing Sheets

GRAPHENE LAYER FOR REDUCED CONTACT RESISTANCE

PRIORITY INFORMATION

This application claims priority to U.S. Provisional Patent No. 62/750,485 filed Oct. 25, 2018 and entitled "Graphene Integrated Conductive Features in Semiconductor Devices," the disclosure of which is hereby incorporated by reference in the entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as the widths of interconnect lines continuously shrink, a contact area between a via bottom barrier layer and a metal conductor becomes smaller and smaller, which leads to higher contact resistance between the via and the metal conductor. It is desirable to reduce this contact resistance, particularly as technology nodes shrink.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
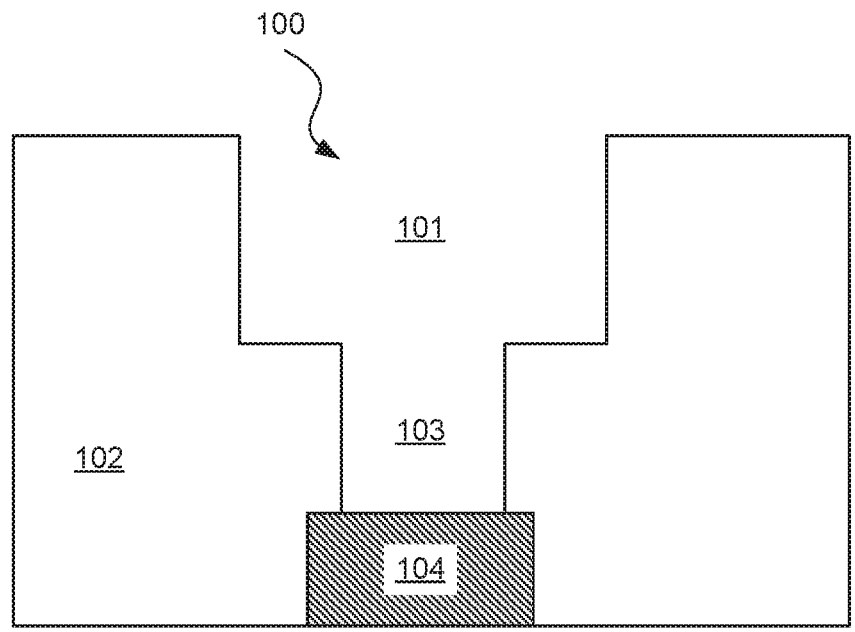
FIGS. 1A-1G are diagrams showing an illustrative process for forming a graphene layer between a via and a conductive feature, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to reduce the contact resistance between conductive structures, particularly as technology nodes shrink. According to principles described herein, a thin graphene layer is formed between a via and a conductive feature. The presence of the graphene layer reduces the contact resistance between the via and the conductive feature. The reduced contact resistance between the via and the conductive feature improves the performance of the device.

FIGS. 1A-1G are diagrams showing an illustrative process for forming a graphene layer between a via and a conductive feature. FIG. 1A illustrates a trench 100 formed into a dielectric layer 102. The trench includes an upper portion 101 and a lower portion 103. The trench 100 exposes an underlying conductive feature 104.

The dielectric layer 102 may be an Interlayer Dielectric Layer (ILD). The ILD may include a dielectric material such as silicon nitride. Other dielectric materials may be used as well. The ILD may be deposited over various devices formed into a semiconductor substrate. For example, the ILD may be deposited over transistor devices, which include gate, source, and drain components. The ILD layer may be formed in multiple layers, each layer having a particular configuration of interconnect lines. The interconnect lines are conductive structures, such as metal lines, which connect various devices (e.g., transistors) so as to form particular circuits. The interconnect lines formed within a particular ILD layer may connect to interconnect lines from other layers through a via.

The conductive feature 104 may be one of a variety of conductive features. In one example, the conductive feature 104 is a metal interconnect line at a lower level within the dielectric layer 102. In some examples, the conductive feature 104 may be a gate contact or a source/drain contact. Other types of conductive features are contemplated as well.

The conductive feature 104 is exposed by the trench 100. The trench includes an upper portion 101 and a lower portion 103. In the present example, the lower portion 103 is sized and shape for forming a via therein. Thus, the lower portion 103 may also be referred to as a via portion. The upper portion 101 is sized and shaped for an interconnect line and may thus also be referred to as an interconnect portion. The trench 100 may be formed through a variety of photolithographic processes. For example, the lower portion 103 may be formed first by an etching process that is applied to form a hole extending from a top of the dielectric layer 102 down to the conductive feature 104. Then, a second patterning and etching process may be applied to form the upper portion 101 of the via. The etching process to form the upper portion 101 may be applied to form a hole that extends into the dielectric layer 102 without extending all the way to the conductive feature 104.

Figure 1B:
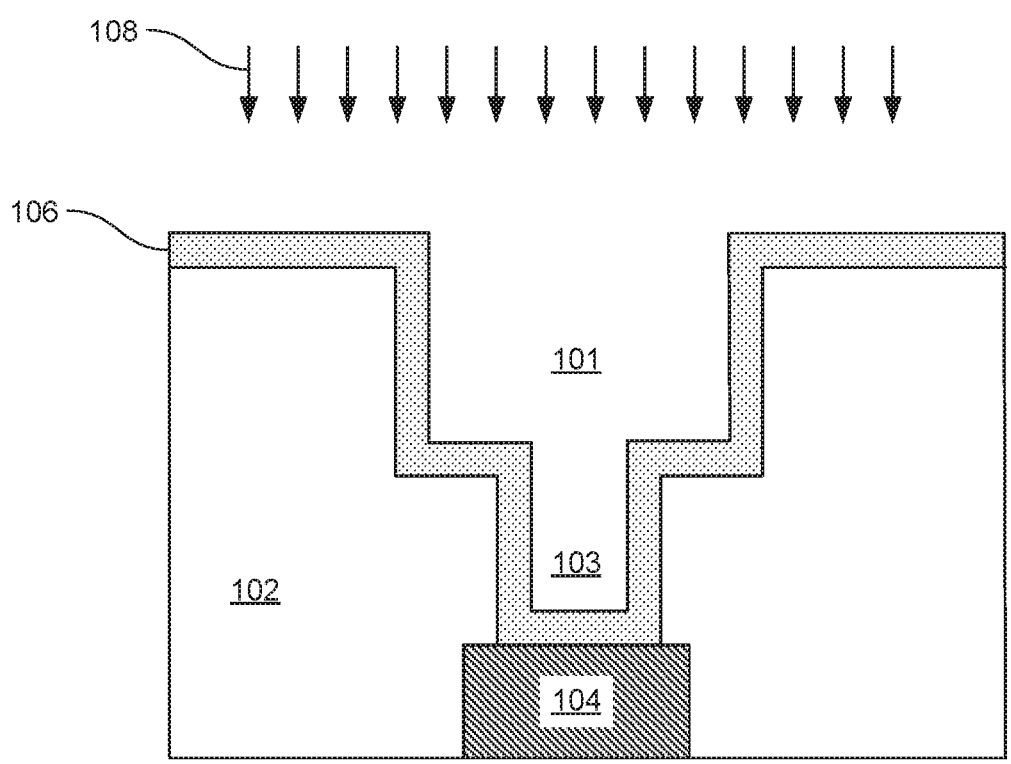

FIG. 1B illustrates a process 108 for depositing a seed layer 106 within the trench 100. The seed layer 106 may be formed of one of a variety of materials. Such materials may include, but are not limited to, cobalt, nickel, iron, or copper. These are examples of materials that can be used as a catalyst for graphene growth. The seed layer 106 may be formed of other materials which may be used as a catalyst for graphene growth. The seed layer 106 may have a thickness within a range of about 5-100 Angstroms.

The seed layer 106 is formed in a conformal manner. In other words, the seed layer conforms to the sidewalls and bottom of the trench 100. The process 108 used to form the seed layer may be one of a variety of processes, including but not limited to, Physical Vapor Deposition (PVD), Atomic Layer Deposition (ALD), Chemical Vapor Deposition (CVD), Plasma Enhanced Atomic Layer Deposition (PEALD) or Plasma Enhanced Chemical Vapor Deposition (PECVD). Other processes may be used as well.

PVD is a process by which a material, such as carbon, is put into a vapor, and then deposited from that vapor onto a substrate. An ALD process involves sequentially and alternatingly applying different materials to form a thin film layer on a substrate positioned within a deposition chamber. Particularly, the ALD process involves a number of cycles. Each cycle involves a deposition process and a purge process. The deposition processes for a set of cycles alternate between different types of materials being deposited. The purge process for each of the cycles is used to remove material from the deposition chamber before the subsequent cycle is performed.

One type of ALD process is a PEALD process. For a PEALD process, each cycle includes a plasma treatment process followed by a post-plasma purge process. The plasma treatment process provides a number of benefits to improve the quality of the ALD process.

A CVD process involves exposing the substrate to a volatile precursor, which reacts or decomposes on the substrate to produce the desired deposit. One type of CVD process is a PECVD process. A PECVD process uses plasma to enhance the rate of deposition. This allows the process to be performed at lower temperatures.

Figure 1C:
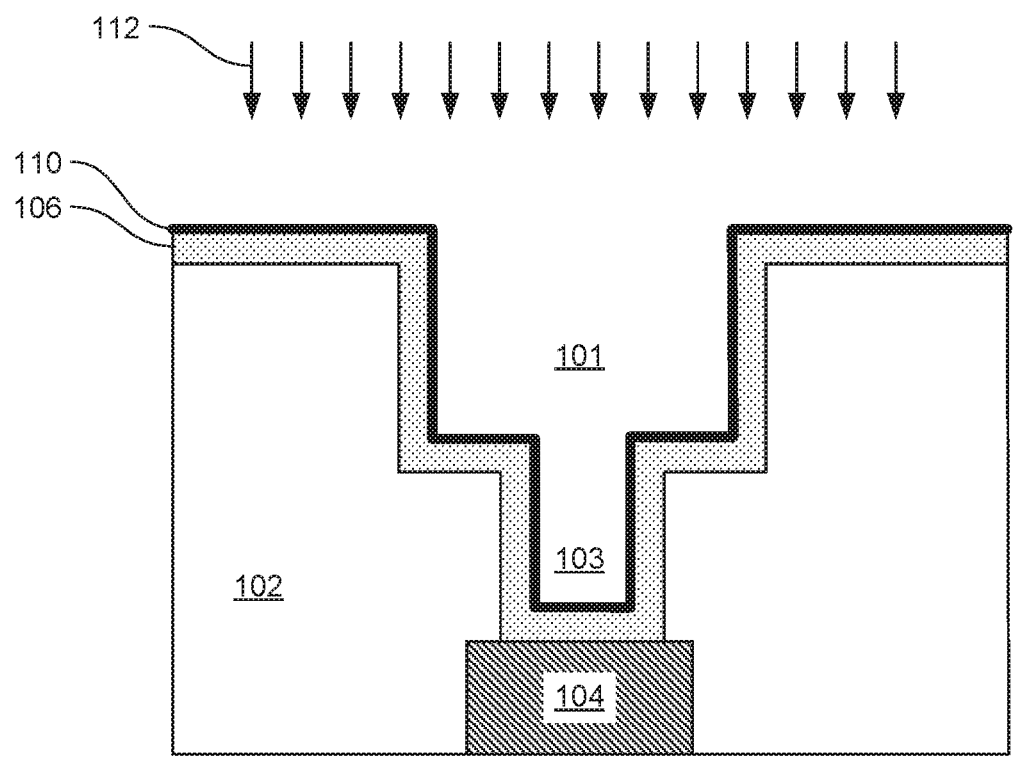

FIG. 1C illustrates the deposition of a carbon layer 110 through a carbon deposition process 112. The carbon deposition process 112 may conformally deposit the carbon layer 110 on the seed layer 106. The carbon deposition process 112 may be one of: PVD, ALD, CVD, PEALD, or PECVD. The carbon layer 110 may have a thickness within a range of about 5-100 Angstroms.

Figure 1D:
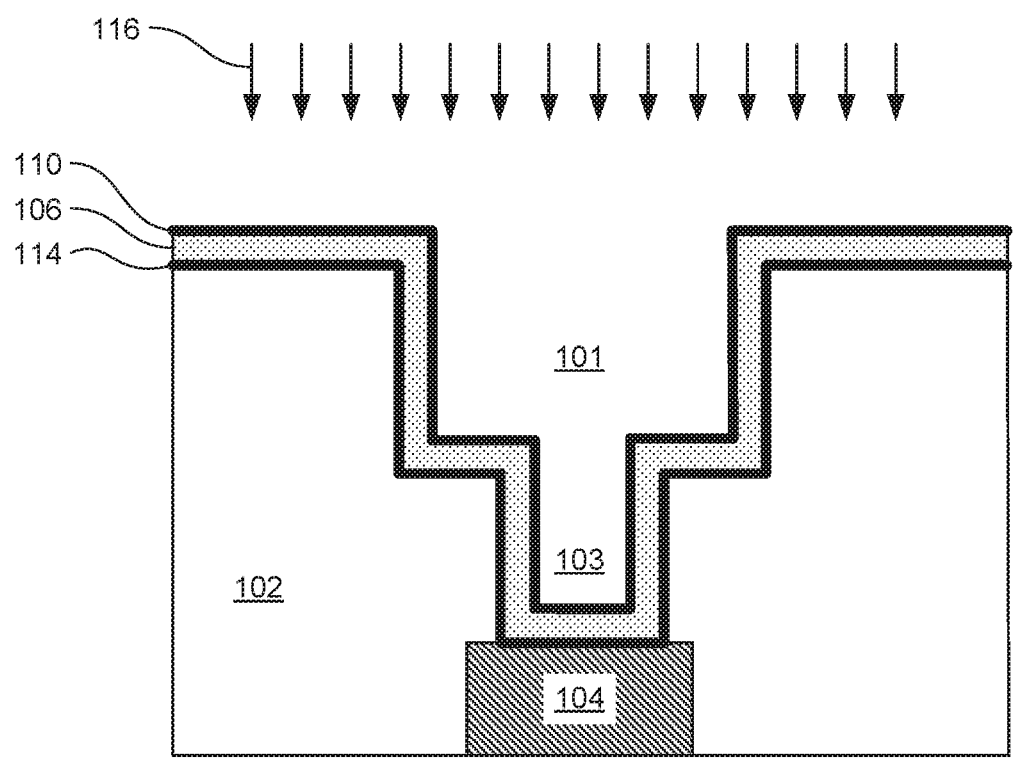

After the carbon layer 110 is deposited, a carbon dissolution process 116 is applied, as shown in FIG. 1D. The carbon dissolution process 116 causes carbon atoms from the carbon layer 110 to migrate to the dielectric layer 102, and the conductive feature 104. This migration results in a graphene layer 114 positioned between the conductive feature 104 and the seed layer 106, as well as between the dielectric layer 102 and the seed layer 106.

In one example, the carbon dissolution 116 process involves an annealing process. The annealing process may be applied at a temperature within a range of about 200-1200 degrees Celsius. The annealing process may also be applied at a pressure within a range of about 0.25 torr-30 atm. The annealing process heats up the seed layer 106 to a high temperature. In this high temperature state, some of the carbon atoms from the carbon layer 110 are able to migrate through the seed layer 106 and form one or more graphene layers 114 on the opposite side of the seed layer 106.

Graphene is an allotrope of carbon. It includes a layer of carbon atoms that are arranged in a hexagonal lattice. In some examples, the graphene layer 114 may include anywhere from 1-10 layers of carbon atoms. Graphene has a variety of desirable properties. One desirable properly is that graphene has a high conductance. Thus, the presence of the graphene layer 114 reduces the contact resistance between the conductive feature and the seed layer 106.

Figure 1E:
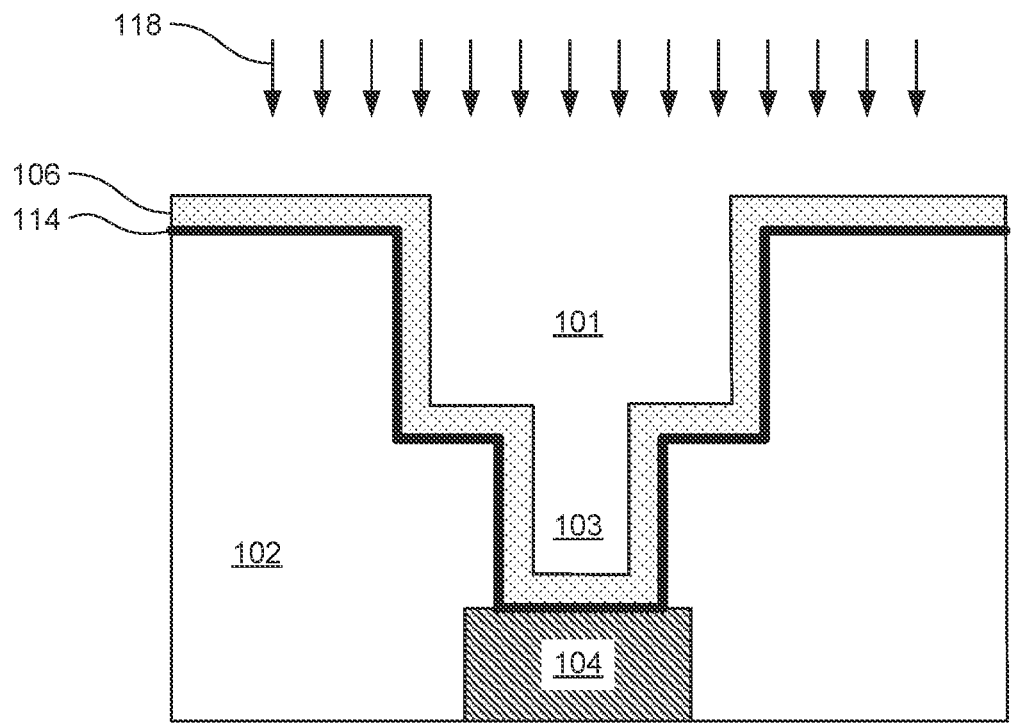

After the graphene layer 114 is formed, the carbon layer 110 may be removed through a removal process 118, as shown in FIG. 1E. The removal process 118 may be, for example, a selective etching process. A selective etching process may be designed to remove the carbon layer 110 without substantially affecting the seed layer 106 underneath. The selective etching process may be a wet etching process or a dry etching process.

In the case of a dry etching removal process, the dry etching process may involve the following. In the case of Ion-Beam Etching (IBE), the etching process may be applied at a power level within a range of about 100-2000 V. The beam angle may be within a range of about 0-70 degrees. The gas used for the etching process may include at least one of: Helium (He), Neon (Ne), Argon (Ar), Krypton (Kr), and Xenon (Xe). In the case of reactive ion etching, the etching process may be applied with a power within a range of 100-1500 watts, a bias voltage within a range of 0-300 volts, and using an organic gas such as CH3COOH, CH3OH, or CH3CH2OH. In another example, the dry etching process may be applied with a power within a range of about 100-1500 watts, a bias voltage within a range of about 0-500 volts, using a gas such as CF4, CHF3, CH3F, CH2F2, C4F8, C4F6, N2, O2 or Ar. In another example, the dry etching process may be a reactive ion etching applied with a power within a range of about 100-2000 watts, a bias voltage within a range of about 0-500 volts, using a gas such as Cl2, SiCl4, BCl3, CF4, CHF3, CH3F, CH2F2, C4F8, C4F6, N2, O2 or Ar. Such examples are for dry etching processes that are ideal for removing the carbon layer 110.

In the case of a wet etching removal process, the wet cleaning component may include at least one of the following: Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl) benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol) bis(amine), (2-Methylbutyl)amine, Tris(2-ethylhexyl)amine, (4-Isothiocyanatophenyl)(3-methylphenyl) amine, Poly(ethylene glycol) methyl ether amine, Poly (ethylene glycol) diamine, Triethanolamine hydrochloride, Triethanolamine, Trolamine, Trolamine salicylate, 2-Chloroethyl vinyl ether, 2-[4-(Dimethylamino)phenyl]ethanol, Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, 1-Acetylguanidine, or general acid. Furthermore, the wet etching process may use an inhibitor component that includes at least one of the following: 1-Chlorobenzotriazole, 5-Chlorobenzotriazole, 5-Methyl-1H-benzotriazole, 1-methyl-1H-1,2,3-benzotriazole-5-carbaldehyde, 1-Methyl-1H-1,2,3-benzotriazol-5-amine, 1-Methylimidazole, 2-Mercapto-1-methylimidazole, 1-Methylimidazole-2-sulfonyl chloride, 5-Chloro-1-methylimidazole, 5-Iodo-1-methylimidazole, Thiamazole, 1-Methylimidazolium chloride, 2,5-Dibromo-1-methyl-1H-imidazole, 1H-Benzotriazole-4-sulfonic acid, BTA-like, and etc. Such examples are for wet etching processes that are ideal for removing the carbon layer 110.

Figure 1F:
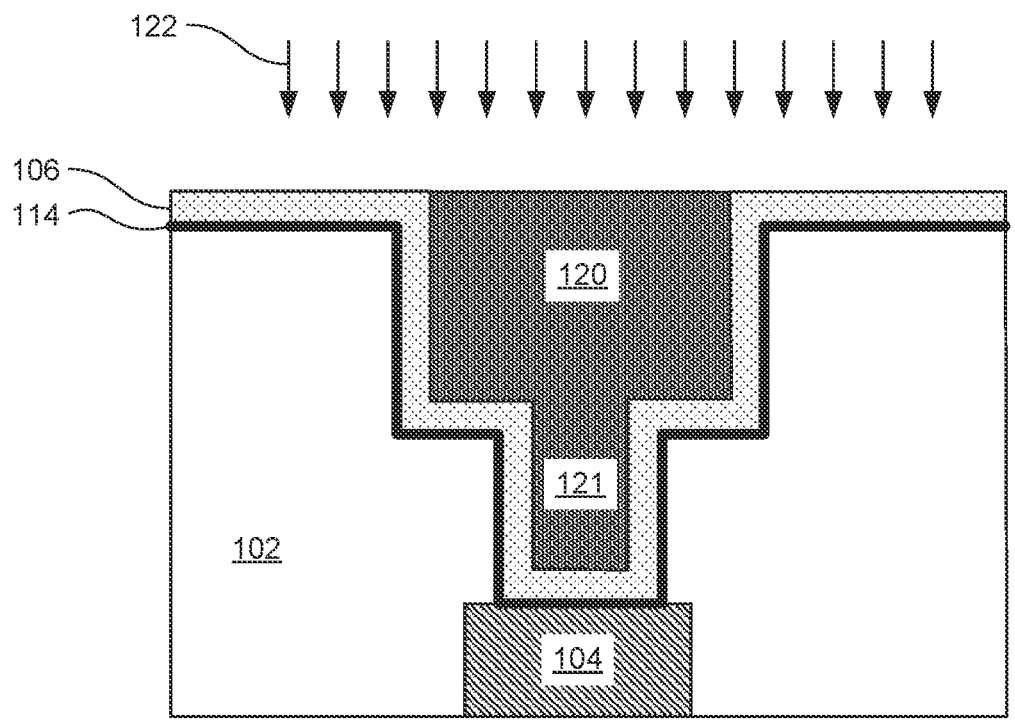

FIG. 1F illustrates a deposition process to deposit a metal to create the via 121 and the interconnect 120. In some examples, the metal interconnect 120 may be similar to the underlying conductive feature 104. In some examples, the metal interconnect and the via may include copper. Other conductive materials may be used.

Figure 1G:
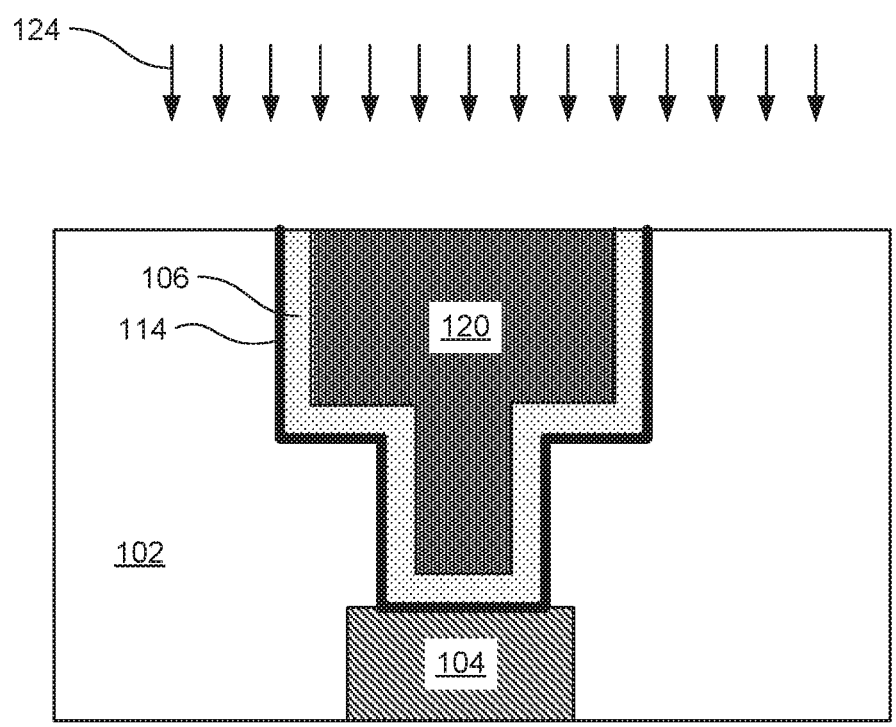

FIG. 1G illustrates the metal interconnect 120 and the via 121 after a Chemical Mechanical Polishing (CMP) process is performed. Such process planarizes and exposes the surface of the ILD layer 102. After the CMP process is performed, subsequent ILD layers may be deposited. Such subsequent ILD layers may also have metal interconnects and vias formed therein using the graphene layer as described above to reduce contact resistance.

Figure 2A:
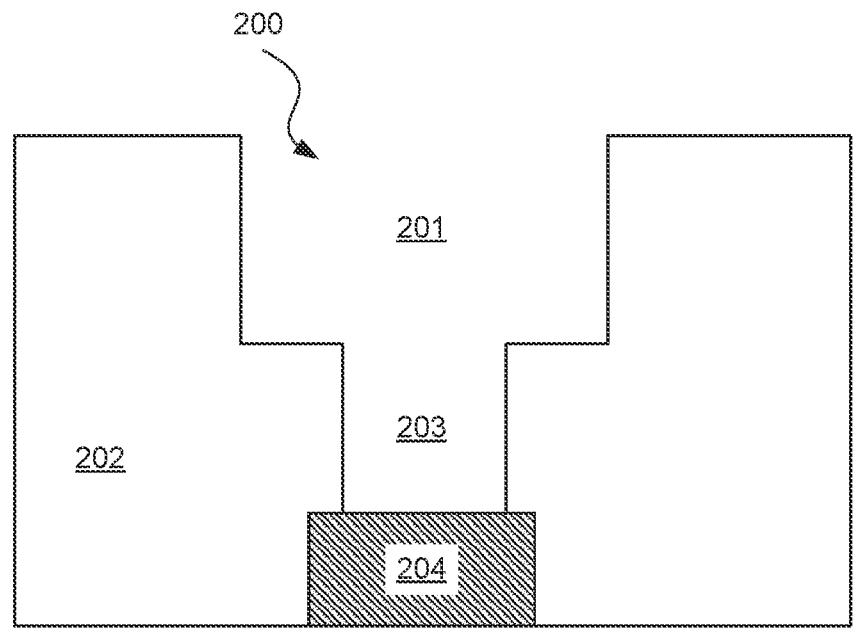
FIGS. 2A-2G are diagrams showing an illustrative process for forming a graphene layer between a via and a conductive feature, according to one example of principles described herein.

FIGS. 2A-2G are diagrams showing an illustrative process for forming a graphene layer between a via and a conductive feature. FIG. 2A illustrates a trench 200 formed into a dielectric layer 202. The trench includes an upper portion 201 and a lower portion 203. The trench 200 exposes an underlying conductive feature 204.

The dielectric layer 202 may be an Interlayer Dielectric Layer (ILD). The ILD may include a dielectric material such as silicon nitride. Other dielectric materials may be used as well. The ILD may be deposited over various devices formed into a semiconductor substrate. For example, the ILD may be deposited over transistor devices, which include gate, source, and drain components. The ILD layer may be formed in multiple layers, each layer having a particular configuration of interconnect lines. The interconnect lines are conductive structures, such as metal lines, which connect various devices (e.g., transistors) so as to form particular circuits. The interconnect lines formed within a particular ILD layer may connect to interconnect lines from other layers through a via.

The conductive feature 204 may be one of a variety of conductive features. In one example, the conductive feature 204 is a metal interconnect line at a lower level within the dielectric layer 202. In some examples, the conductive feature 204 may be a gate contact or a source/drain contact. Other types of conductive features are contemplated as well.

The conductive feature 204 is exposed by the trench 200. The trench includes an upper portion 201 and a lower portion 203. In the present example, the lower portion 203 is sized and shaped for forming a via therein. Thus, the lower portion 203 may also be referred to as a via portion. The upper portion 201 is sized and shaped for an interconnect line and may thus also be referred to as an interconnect portion. The trench 200 may be formed through a variety of photolithographic processes. For example, the lower portion 203 may be formed first by an etching process that is applied to form a hole extending from a top of the dielectric layer 202 down to the conductive feature 204. Then, a second patterning and etching process may be applied to form the upper portion 201 of the trench. The etching process to form the upper portion 201 may be applied to form a hole that extends into the dielectric layer 202 without extending all the way to the conductive feature 204.

Figure 2B:
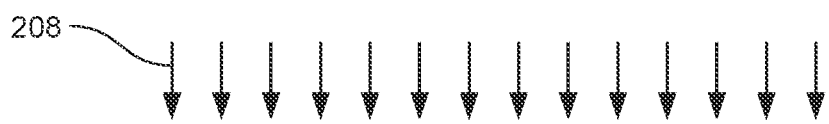
Figure 2B:
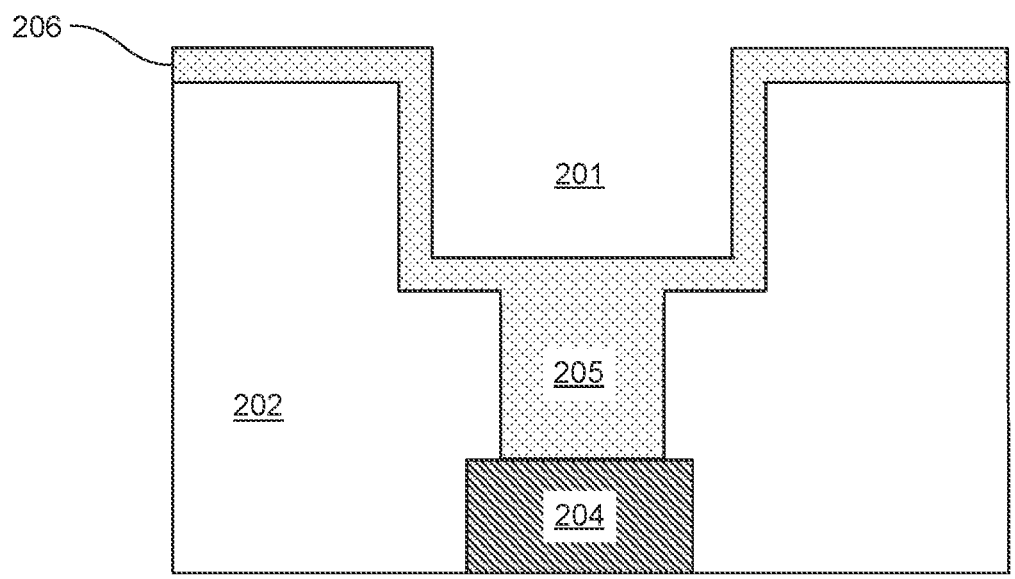

FIG. 2B illustrates a process 208 for depositing a seed layer 206 within the trench 200. The example shown in FIGS. 2A-2G differs from that of FIGS. 1A-1G in that the bottom portion 203 of the trench is filled with a pre-fill layer 205 before the seed layer is applied. In some examples, the pre-fill layer 205 is formed of the same material as the seed layer. For example, if the seed layer is formed of nickel, then the pre-fill layer may also include nickel. However, in some examples, the pre-fill layer 205 may be formed of a different material than the seed layer 206. In some examples, the pre-fill layer 205 may be deposited using one of: Electro-Less Deposition (ELD), ALD, or CVD.

The seed layer 206 may be formed of one of a variety of materials. Such materials may include, but are not limited to, cobalt, nickel, iron, or copper. These are examples of materials that can be used as a catalyst for graphene growth. The seed layer 206 may be formed of other materials which may be used as a catalyst for graphene growth. The seed layer 206 may have a thickness within a range of about 5-100 Angstroms.

The seed layer 206 is formed in a conformal manner. In other words, the seed layer conforms to the sidewalls and bottom of the upper portion 201 of the trench 200. The process 208 used to form the seed layer may be one of a variety of processes, including but not limited to, Physical Vapor Deposition (PVD), Atomic Layer Deposition (ALD), Chemical Vapor Deposition (CVD), Plasma Enhanced Atomic Layer Deposition (PEALD) or Plasma Enhanced Chemical Vapor Deposition (PECVD). Other processes may be used as well.

Figure 2C:
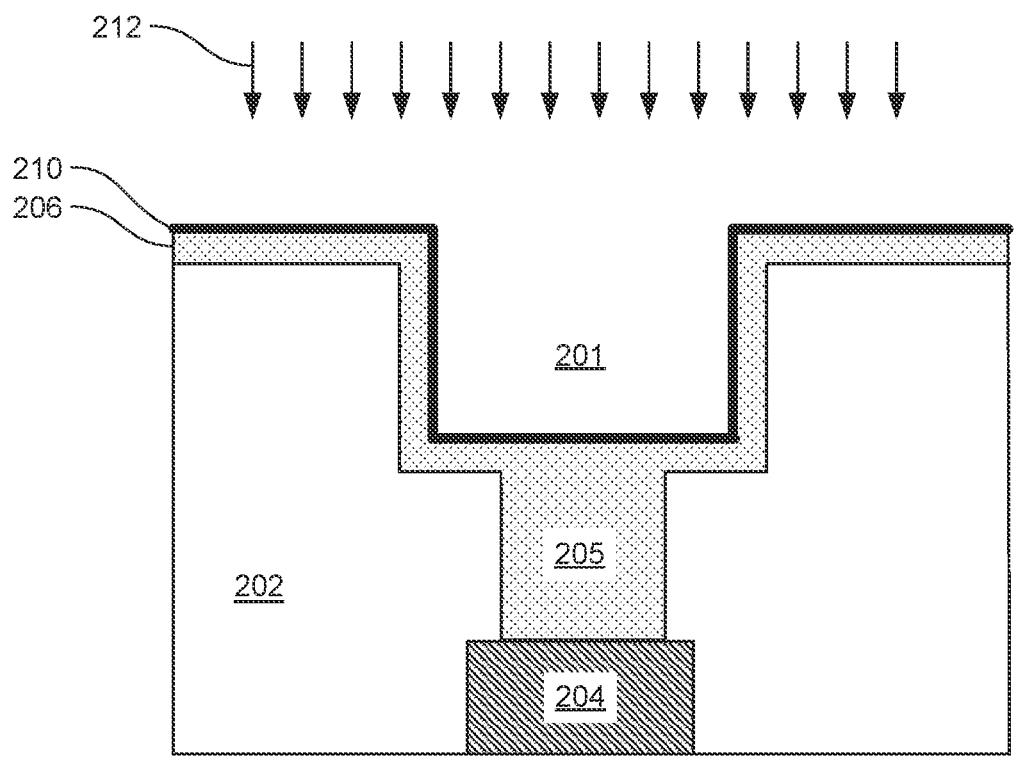

FIG. 2C illustrates the deposition of a carbon layer 210 through a carbon deposition process 212. The carbon deposition process 212 may conformally deposit the carbon layer 210 on the seed layer 206. The carbon deposition process 212 may be one of: PVD, ALD, CVD, PEALD, or PECVD. The carbon layer 210 may have a thickness within a range of about 5-100 Angstroms.

Figure 2D:
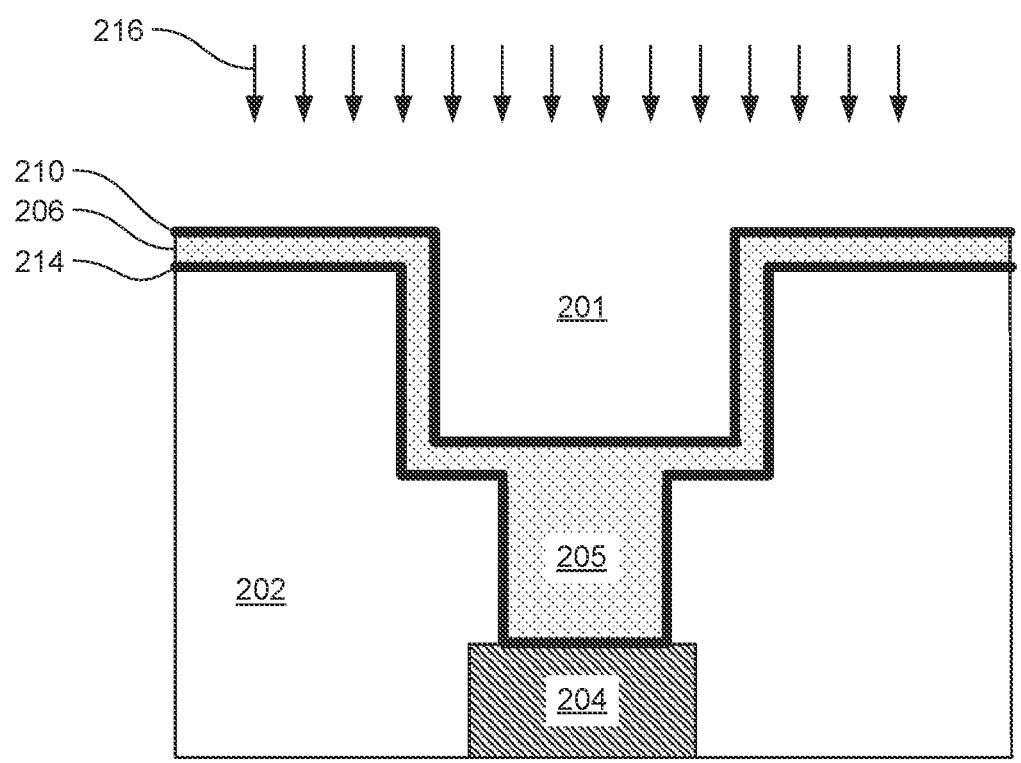

After the carbon layer 210 is deposited, a carbon dissolution process 216 is applied, as shown in FIG. 2D. The carbon dissolution process 216 causes carbon atoms from the carbon layer 210 to migrate to the dielectric layer 202, and the conductive layer 204. As can be seen in FIG. 2D, the carbon atoms are able to migrate through the pre-fill layer 205 as well as the seed layer 206. This migration results in a graphene layer 214 positioned between the conductive feature 204 and the pre-fill layer 205, as well as between the dielectric layer 202 and the seed layer 206.

The carbon dissolution 216 process may involve an annealing process. The annealing process may be applied at a temperature within a range of about 200-1200 degrees Celsius. The annealing process may also be applied at a pressure within a range of about 0.25 torr-30 atm. The annealing process heats up the seed layer 206 to a high temperature. In this high temperature state, some of the carbon atoms from the carbon layer 210 are able to migrate through the seed layer 206 and form one or more graphene layers 214 on the opposite side of the seed layer 206.

Figure 2E:
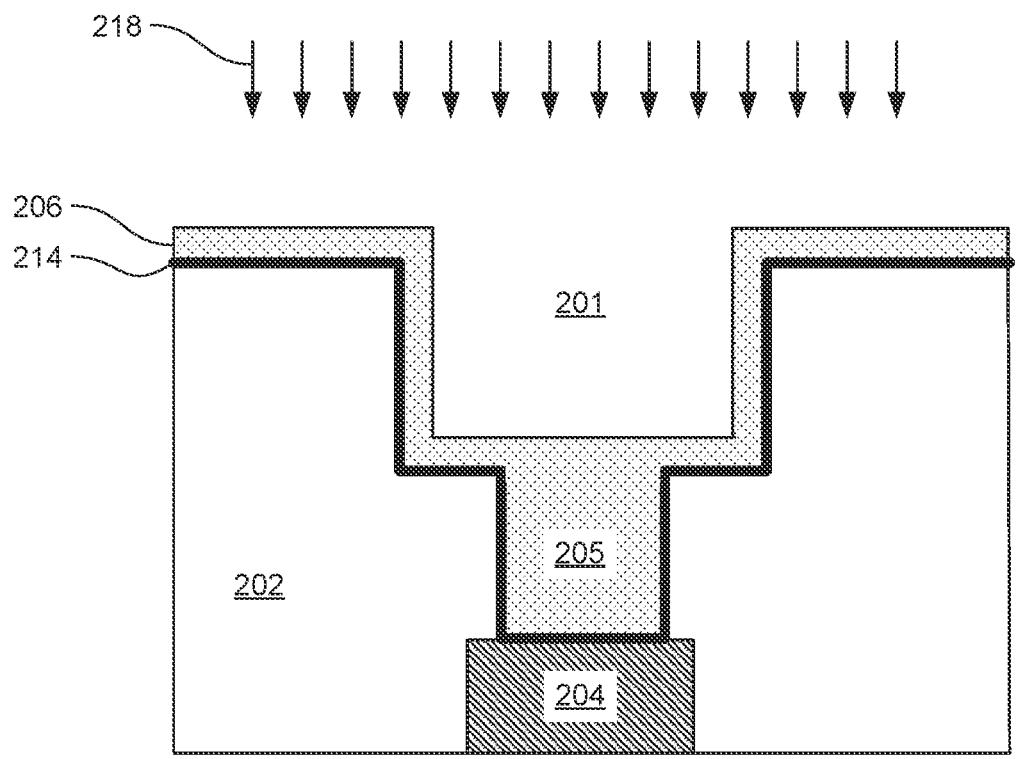

After the graphene layer 214 is formed, the carbon layer 210 may be removed through a removal process 218, as shown in FIG. 2E. The removal process 218 may be, for example, a selective etching process. A selective etching process may be designed to remove the carbon layer 210 without substantially affecting the seed layer 206 underneath. The selective etching process may be a wet etching process or a dry etching process.

Figure 2F:
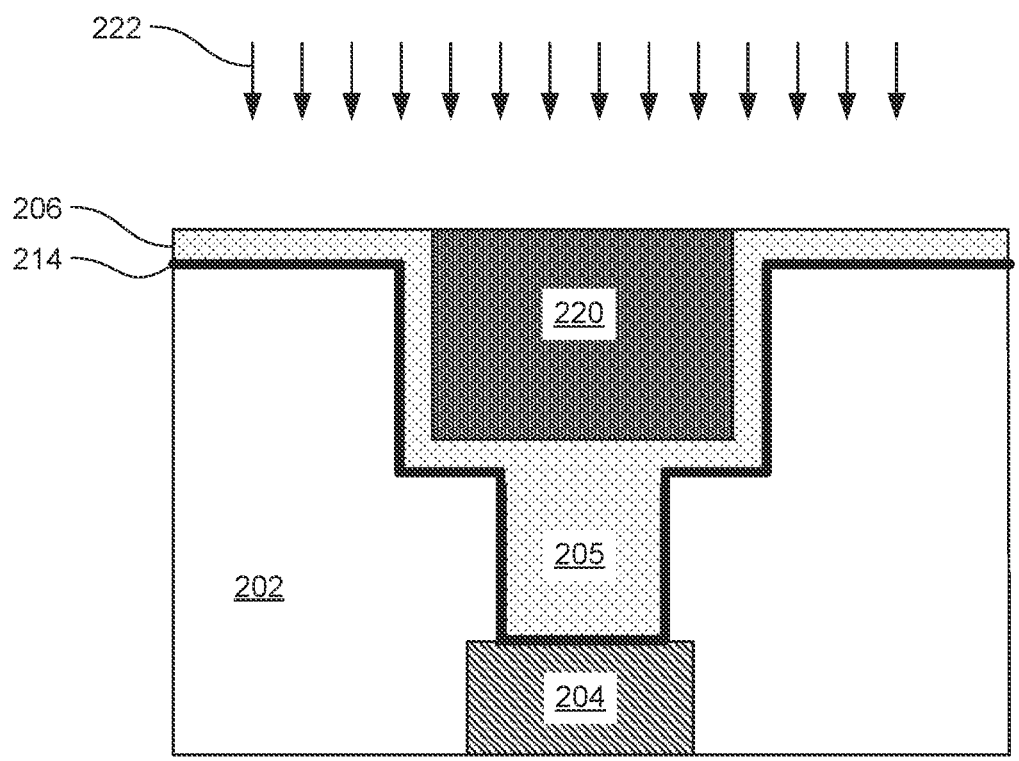

FIG. 2F illustrates a deposition process 222 to deposit a metal to create the interconnect 220. The pre-fill layer 205 acts as a via, as it is a conductive material. In some examples, the metal interconnect 220 may be similar to the underlying conductive feature 204. In some examples, the metal interconnect and the via may include copper. Other conductive materials may be used.

Figure 2G:
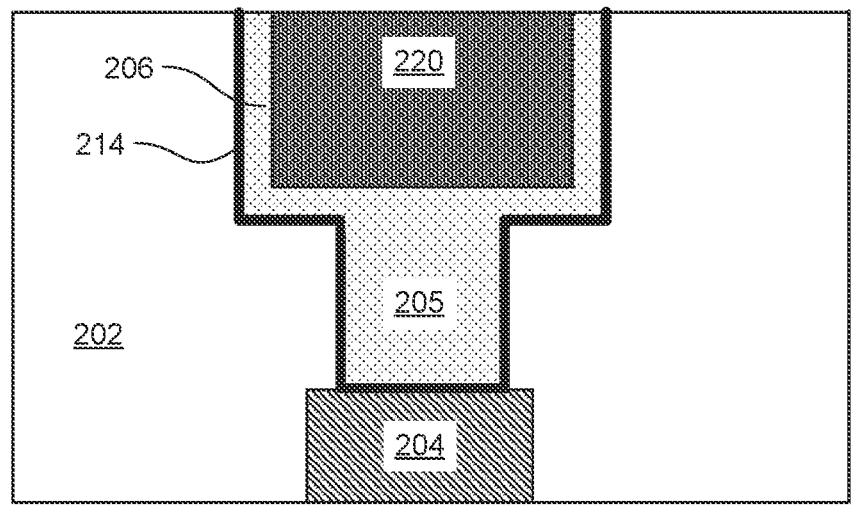

FIG. 2G illustrates the metal interconnect 220 after a Chemical Mechanical Polishing (CMP) process 224 is performed. Such process planarizes and exposes the surface of the ILD layer 202. After the CMP process is performed, subsequent ILD layers may be deposited. Such subsequent ILD layers may also have metal interconnects and vias formed therein using the graphene layer as described above to reduce contact resistance.

Figure 3:
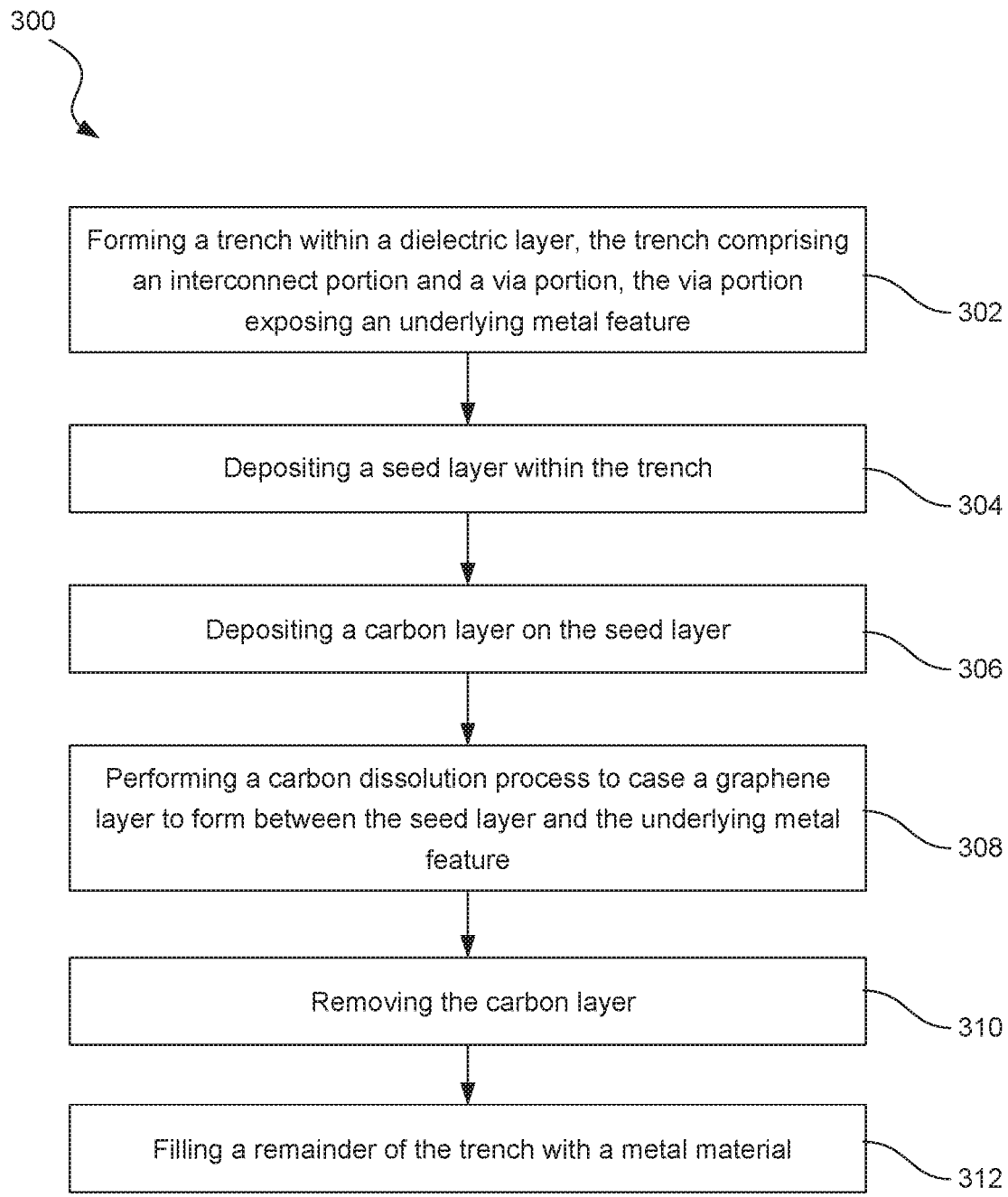
FIG. 3 is a flowchart showing an illustrative method for forming a graphene layer between a via and a conductive feature, according to one example of principles described herein.

FIG. 3 is a flowchart showing an illustrative method 300 for forming a graphene layer (e.g., 114, 214) between a via (e.g., 121, 205) and a conductive feature (e.g., 104, 204). According to the present example, the method includes a process 302 for forming a trench (e.g., 100, 200) within a dielectric layer (e.g., 102, 202), the trench comprising an interconnect portion (e.g., 101, 201) and a via portion (e.g., 103, 203), the via portion exposing an underlying conductive feature. The trench may be formed through a variety of photolithographic processes. For example, the via portion may be formed first by an etching process that is applied to form a hole extending from a top of the dielectric layer down to the conductive feature. Then, a second patterning and etching process may be applied to form the interconnect portion of the trench. The etching process to form the interconnect portion may be applied to form a hole that extends into the dielectric layer without extending all the way to the conductive feature.

The method 300 further includes a process 304 for depositing a seed layer (e.g., 106, 206) within the trench. The seed layer may be formed of one of a variety of materials. Such materials may include, but are not limited to, cobalt, nickel, iron, or copper. These are examples of materials that can be used as a catalyst for graphene growth. The seed layer 106 may be formed of other materials which may be used as a catalyst for graphene growth. The seed layer 106 may have a thickness within a range of about 5-100 Angstroms. In some examples, such as the one in FIG. 1B, the seed layer is formed in both the interconnect portion and the via portion. In some examples, such as the one in FIG. 2B, the seed layer is formed in the interconnect portion on top of the pre-fill layer (e.g., 205).

The method 300 further includes a process 306 for depositing a carbon layer (e.g., 110, 210) on the seed layer. The carbon deposition process may conformally deposit the carbon layer on the seed layer. The carbon deposition process may be one of: PVD, ALD, CVD, PEALD, or PECVD. The carbon layer may have a thickness within a range of about 5-100 Angstroms.

The method 300 further includes a process 308 for performing a carbon dissolution process to cause a graphene layer (e.g., 114, 214) to form between the seed layer and the underlying conductive feature. The carbon dissolution process causes carbon atoms from the carbon layer to migrate to the dielectric layer, and the conductive layer. This migration results in a graphene layer positioned between the conductive feature and the seed layer, as well as between the dielectric layer and the seed layer. The carbon dissolution process may involve an annealing process. The annealing process may be applied at a temperature within a range of about 200-1200 degrees Celsius. The annealing process may also be applied at a pressure within a range of about 0.25 torr-30 atm.

The method 300 further includes a process 310 for removing the carbon layer. The removal process may be, for example, a selective etching process. A selective etching process may be designed to remove the carbon layer without substantially affecting the seed layer underneath. The selective etching process may be a wet etching process or a dry etching process.

The method 300 further includes a process 312 for filling a remainder of the trench with a conductive material. Filling the trench may include a deposition process to deposit a metal to create an interconnect feature (e.g., 120, 220). In some examples, where there was no pre-fill layer (e.g., 205) filling the trench includes filling the lower portion of the trench to create the via (e.g., 121). In some examples, the metal interconnect may be similar to the underlying conductive feature. In some examples, the metal interconnect and the via may include copper. Other conductive materials may be used.

After the trench is filled, a Chemical Mechanical Polishing (CMP) process may be performed. Such process planarizes and exposes the surface of the ILD layer. After the CMP process is performed, subsequent ILD layers may be deposited. Such subsequent ILD layers may also have metal interconnects and vias formed therein using the graphene layer as described above to reduce contact resistance.

According to one example, a method includes forming a trench within a dielectric layer, the trench comprising an interconnect portion and a via portion, the via portion exposing an underlying conductive feature. The method further includes depositing a seed layer within the trench, depositing a carbon layer on the seed layer, performing a carbon dissolution process to cause a graphene layer to form between the seed layer and the underlying conductive feature, and filling a remainder of the trench with a conductive material.

According to one example, a method includes forming a trench within a dielectric layer, the trench exposing an underlying conductive feature, depositing a seed layer within the trench, depositing a carbon layer on the seed layer, performing a carbon dissolution process to case a graphene layer to form between the seed layer and the underlying conductive feature, and removing the carbon layer.

According to one example, a semiconductor structure includes a conductive feature embedded within an interlayer dielectric layer (ILD), an interconnect feature embedded within the ILD, a via electrically connecting the conductive feature to the interconnect feature, a graphene layer positioned between the via and the conductive feature, the graphene layer in direct contact with the conductive feature, and a seed layer positioned between the graphene layer and the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a trench within a dielectric layer, the trench comprising an interconnect portion and a via portion, the via portion exposing an underlying conductive feature;

depositing a seed layer within the trench;

depositing a carbon layer on the seed layer;

performing a carbon dissolution process to cause a graphene layer to form between the seed layer and the underlying conductive feature; and filling a remainder of the trench with a conductive material.

2. The method of claim 1, wherein the seed layer is formed in both the interconnect portion and the via portion.

3. The method of claim 1, further comprising, before forming the seed layer, depositing a pre-fill material in the via portion, wherein the seed layer is formed on the pre-fill material in the trench.

4. The method of claim 1, wherein the seed layer comprises one of: nickel, cobalt, iron or copper.

5. The method of claim 1, wherein a thickness of the seed layer is within a range of about 5-100 Angstroms.

6. The method of claim 1, wherein the carbon layer is deposited via one of: Physical Vapor Deposition (PVD), Atomic Layer Deposition (ALD), Chemical Vapor Deposition (CVD, Plasma Enhanced Atomic Layer Deposition (PEALD) or Plasma Enhanced Chemical Vapor Deposition (PECVD).

7. The method of claim 1, wherein the carbon layer has a thickness within a range of about 5-100 Angstroms.

8. The method of claim 1, wherein the carbon dissolution process comprises an annealing process applied at a temperature range of about 200-1200 degrees.

9. The method of claim 8, wherein the annealing process performed with a pressure range of about 0.25 torr 30 atm.

10. The method of claim 1, further comprising, after the carbon dissolution process, removing the carbon layer.

11. The method of claim 10, wherein the carbon layer is removed using one of wet-etching or dry-etching.

12. A method comprising:

forming a trench within a dielectric layer, the trench exposing an underlying conductive feature;

depositing a seed layer within the trench;

depositing a carbon layer on the seed layer;

performing a carbon dissolution process to cause a graphene layer to form between the seed layer and the underlying conductive feature; and removing the carbon layer.

13. The method of claim 12, wherein the trench comprises an upper portion and a lower portion.

14. The method of claim 13, further comprising, depositing the seed layer in both the upper portion and the lower portion.

15. The method of claim 13, further comprising, depositing a pre-fill layer in the lower portion.

16. The method of claim 15, wherein depositing the seed layer comprises depositing the seed layer in the upper portion and on the pre-fill layer.

17. The method of claim 12, wherein the seed layer is one of: cobalt, iron, copper, and nickel.

18. A semiconductor structure comprising:

a conductive feature embedded within an interlayer dielectric layer (ILD);

an interconnect feature embedded within the ILD;

a via electrically connecting the conductive feature to the interconnect feature;

a graphene layer positioned between the via and the conductive feature, the graphene layer in direct contact with the conductive feature; and a seed layer positioned between the graphene layer and the via, the seed layer interfacing with the via and the interconnect feature.

19. The semiconductor structure of claim 18, wherein the graphene layer has a thickness within a range of about 1-10 atoms.

20. The semiconductor structure of claim 18, wherein the seed layer comprises one of: nickel, iron, copper, and cobalt.

* * * * *